United States Patent [19]
Tsukagoshi et al.

[11] Patent Number: 5,981,014
[45] Date of Patent: Nov. 9, 1999

[54] OPTICAL RECORDING MEDIUM AND METHOD FOR PREPARING THE SAME

[75] Inventors: Takuya Tsukagoshi; Masanori Kosuda; Hiroshi Shingai, all of Nagano, Japan

[73] Assignee: TDK Corporation, Tokyo, Japan

[21] Appl. No.: 09/075,849

[22] Filed: May 12, 1998

[30] Foreign Application Priority Data

May 29, 1997 [JP] Japan .................................. 9-155865

[51] Int. Cl.$^6$ ....................................................... B32B 3/00
[52] U.S. Cl. ........................ 428/64.1; 428/64.4; 428/64.5; 428/913; 430/270.13; 430/495.1; 430/945; 369/283; 369/288
[58] Field of Search .................................. 428/64.1, 64.2, 428/64.4, 64.5, 913; 430/270.13, 495.1, 945; 369/283, 288

[56] References Cited

U.S. PATENT DOCUMENTS 5,627,012  5/1997  Tominaga et al. .
5,882,759  3/1999  Hirotsune et al. ..................... 428/64.1
5,891,542  4/1999  Tominaga et al. ..................... 428/64.1

FOREIGN PATENT DOCUMENTS 8-106647   4/1996  Japan .
8-352298  12/1996  Japan .

Primary Examiner—Elizabeth Evans
Attorney, Agent, or Firm—Laubscher & Laubscher; R. J. Lasker

[57] ABSTRACT

An optical recording medium of phase change type with an increased number of overwritable operations and method for preparing such an optical recording medium is provided. In the optical recording medium of phase change type whose rate determining stage in the production has been the initialization of the recording layer, the time required for the production is reduced, and stable recording/reproducing properties are realized from the first overwriting operation. The optical recording medium comprises a transparent substrate and a recording layer on the transparent substrate. In the medium, the recording layer comprises at least one Sb-based thin film and at least one reactive thin film; the Sb-based thin film is in contact with said reactive thin film; the Sb-based thin film has been formed from an Sb-based material containing at least 95 at % of Sb; and the reactive thin film has been formed from an In-Ag-Te-based material mainly comprising In, Ag and Te or In, Ag, Te and Sb; and the reactive thin film contains 0.5 to 10 at % of oxygen. In the formation of the reactive thin film, the sputtering is conducted by introducing an inert gas and oxygen gas into the sputtering chamber.

17 Claims, 1 Drawing Sheet

OPTICAL RECORDING MEDIUM AND METHOD FOR PREPARING THE SAME

BACKGROUND OF THE INVENTION

1. Field of the Invention

This invention relates to an optical recording medium of phase change type and a method for preparing such an optical recording medium.

2. Prior Art

Highlight is recently focused on optical recording media capable of recording information at a high density and erasing the recorded information for overwriting. One typical rewritable (or erasable) optical recording medium is of the phase change type wherein a laser beam is directed to the recording layer to change its crystallographic state whereupon a change of reflectance by the crystallographic change is detected for reproduction of the information. Optical recording media of the phase change type are of great interest since they can be directly overwritten by modulating the intensity of a single light beam and the optical system of the drive unit used for their operation is simple as compared with magneto-optical recording media.

Most optical recording media of the phase change type used Ge-Te systems which provide a substantial difference in reflectance between crystalline and amorphous states and have a relatively stable amorphous state. It was also recently proposed to use new compounds known as chalcopyrites.

Chalcopyrite compounds were investigated as compound semiconductor materials and have been applied to solar batteries and the like. The chalcopyrite compounds are composed of Ib-IIIb-VIb$_2$ or IIb-IVb-Vb$_2$ as expressed in terms of the Groups of the Periodic Table and have two stacked diamond structures. The structure of chalcopyrite compounds can be readily determined by X-ray structural analysis and their basic characteristics are described, for example, in Physics, Vol. 8, No. 8 (1987), pp. 441 and Denki Kagaku (Electrochemistry), Vol. 56, No. 4 (1988), pp. 228.

Among the chalcopyrite compounds, AgInTe$_2$ is known to be applicable as a recording material by diluting it with Sb or Bi. The resulting optical recording media are generally operated at a linear velocity of about 7 m/s. See Japanese Patent Application Kokai Nos. (JP-A) 240590/1991, 99884/1991, 82593/1991, 73384/1991, and 151286/1992.

In addition to these phase change type optical recording media using chalcopyrite compounds, JP-A 267192/1992, 232779/1992, and 166268/1994 disclose phase change type optical recording media wherein an AgSbTe$_2$ phase forms with the crystallization of the recording layer.

In the conventional optical recording medium of phase change type, the recording layer has been formed by such means as vacuum deposition apparatus, and the recording layer immediately after its formation is in non-crystalline state. When the disc having such recording layer is utilized for a rewritable medium, crystallization of the recording layer is generally required and such crystallization is accomplished by a process called initialization.

Various processes have been proposed for the initialization. Typical processes are the process wherein the substrate is heated to crystallization temperature of the recording layer after the deposition of the recording layer (JP-A 3131/1990); the process called "solid phase initialization" wherein the recording layer is crystallized after its deposition by laser beam irradiation (JP-A 366424/1992, 201734/1990, and 76027/1991); a process wherein the substrate having the recording layer deposited thereon is irradiated with a flash light to utilize optical properties of the chalcogen compounds for pseudo-crystallization of the recording layer by photodarkening (JP-A 281219/1992); a process wherein the recording layer is crystallized by means of RF induction heating; a process wherein the substrate is heated simultaneously with the deposition of the recording layer for crystallization (JP-A 98847/1990); a process wherein a dielectric layer is formed as the first layer, and the recording layer is formed on the first layer and heated for crystallization, and the second dielectric layer is formed on the crystallized recording layer (JP-A 5246/1990).

Initialization by laser beam irradiation, however, is a time-consuming process and this process also suffer from insufficient productivity. On the other hand, the process involving the heating of the entire medium prohibited use of inexpensive resin substrates, since the heating during the initialization resulted in deformation of the resin substrate to result in tracking problems. Use of flash light required repeated irradiation to accomplish the crystallization, and productivity was also insufficient.

In view of such situation, an apparatus called "bulk eraser" is currently used for the initialization in commercial scale production. A bulk eraser is an apparatus which is capable of irradiating a high power gas laser or semiconductor laser beam without tight focusing so that multiple tracks can be crystallized at once. Use of such bulk eraser enables localized heating of the recording layer, and temperature elevation of the substrate is thus avoided to enable the use of a resin substrate of low heat resistance.

Initialization with a bulk eraser of a 12 cm optical recording disc, however, usually takes about several ten seconds to several minutes and the process of initialization has been the rate-determining step in the production of the optical recording disc.

In addition, conventional recording media of phase change type required repeated overwriting for a number of times before stable erasability is attained after the initialization. The properties have been generally evaluated after repeating the overwriting operations for about 10 times. Such unstable erasability is estimated to be the result of incomplete formation of the AgSbTe$_2$ crystalline phase and In-Te crystalline phase.

In order to eliminate the step of initialization which had been necessary in the production of the phase change type recording medium, the inventors of the present invention proposed in Japanese Patent Application No. 47822/95 formation of the In-Ag-Te-Sb-based recording layer in separate steps of sputtering Sb plus In and sputtering Ag plus Te; or alternatively, in separate steps of sputtering Sb, sputtering In, and sputtering Ag plus Te. The recording layer formed by such step is at least partially crystallized. The recording layer formed by such process exhibits change in reflectance as in the case of initialization by bulk eraser as described above after full diffusion and mixing of the elements in the layer by repeated recording. The erasability is unstable during the first several overwriting operations immediately after the formation of the recording layer as in the case of conventional recording medium of phase change type. More specifically, reflectance of the region crystallized during the formation of the recording layer is different from the reflectance of the region crystallized in the overwriting, and the reflectance are not stabilized until whole recording layer are overwritten. In the mark edge recording used in rewritable digital video discs (DVD-RAM) and the like, such variation in the reflectance may be erroneously recognized as mark edge.

JP-A 106647/96 discloses a phase change type recording medium having disposed thereon a recording layer of an AbInSbTe-based synthetic lattice film wherein AgSbTe$_2$ film and In-Sb film are disposed one on another, or AgSbTe$_2$ film, In film and Sb film are disposed one on another. One merit of JP-A 106647/96 is reduction in initialization energy of the whole recording layer owing to the use of the crystallized AgSbTe$_2$ film.

However, it has been confirmed by the inventors of the present invention that, when the AgSbTe$_2$ film and the In-Sb film are disposed, the reflectance is not stabilized in the first several overwriting operations after the formation of the recording layer as in the case of the Japanese Patent Application No. 47822/95, and also, that the reflectance is not stabilized in the first several overwriting operations when the AgSbTe$_2$ film, the In film and the Sb film are disposed. To obtain stable reflectance in the crystalline portion upon the overwriting, presence of In-Te crystalline phase in the crystalline portion is necessary. However, when the In is not present in the AgSbTe$_2$ film but present as In-Sb film or In film as in the case of JP-A 106647/96, formation of the In-Te crystalline phase through the binding of In with Te is difficult. In addition, when the initialization is effected with a low energy as in the case of JP-A 106647/96, In-Te crystalline phase is not fully formed and the reflectance is not stabilized until In-Te crystalline phase is fully formed after repeating the overwriting operations for several times. It should be noted that JP-A 106647/96 is silent about specific conditions of the initialization (e.g. linear velocity and laser power).

Furthermore, JP-A 106647/96 only discloses the embodiments wherein the Sb film or the In-Sb film has a thickness of up to 5 nm. The Sb and the In-Sb films formed will not be crystalline when the film has such thickness, and the reflectance of the as formed recording layer is significantly low. When the reflectance is low, focusing of the laser beam is difficult, and uniform heating and hence, uniform initialization is difficult.

It should be noted that In content in the In-Sb film is not disclosed in JP-A 106647/96. However, in the Examples of JP-A 106647/96, the multiple layer structure wherein the In and the Sb are present in separate In film and Sb film and the single layer structure wherein the In and the Sb are present in the In-Sb film are simply compared. Therefore, the composition of the In-Sb film is estimated to be the same as the composition of In film plus Sb film. Since the In film and the Sb film has the same thickness, In content in the In-Sb film is estimated to be about 10 to 15 at %. When the In content as high as 10 to 15 at %, formation of the crystalline film is difficult even if the film thickness were increased. The recording medium formed is also associated with the problem as described above in the initialization.

In view of the situation as described above, the inventors of the present invention proposed in Japanese Patent Application No. 352298/96 a recording layer comprising an Sb-based thin film formed from an Sb-based material and a reactive thin film formed from In-Ag-Te-based material. When the Sb is deposited independently from other elements, Sb which has a high crystallization rate substantially crystallizes during the film formation. In the optical recording media, reflectance $R_O$ of the as formed recording layer (before the initialization); reflectance $R_C$ of crystalline region (erased region) of the recording layer after repeated recording, and minimum reflectance $R_A$ of amorphous region (record mark) of the recording layer after repeated recording are generally in the relation:

$R_A < R_O < R_C$

In other words, the reflectance $R_O$ of the recording layer as formed is generally lower than the reflectance $R_C$. In Japanese Patent Application No. 352298/96, however, $R_O$ is relatively high owing to the Sb thin film which is already crystallized upon completion of the formation. For example, $R_O$ is at least about 60% of $R_C$, and if desired, $R_O$ may be increased to the level equivalent to $R_C$ ($R_O = R_C$). The initialization is thereby facilitated, and in some cases, the initialization can be even eliminated.

The recording medium with the In-Ag-Te-Sb-based recording layer formed by conventional method can no longer substantially endure repeated overwriting after repeated overwriting operations for about 1000 times because of the decrease in the erasability. Increase in the number of overwritable operations is also desirable for the optical recording medium of Japanese Patent Application No. 352298/96.

SUMMARY OF THE INVENTION

First object of the present invention is to provide an optical recording medium of phase change type having an increased number of overwritable operations.

In view of the situation that the initialization of the recording layer has been the rate-determining stage in the production of the optical recording medium of phase change type, second object of the present invention is to reduce the time required for the production of the phage change type optical recording medium which has realized the first object as described above, and to simultaneously realize stable recording/reproducing properties from the first overwriting operation.

The objects as described above are realized by the optical recording medium and the production method thereof as described below in (1) to (18).

(1) An optical recording medium comprising a transparent substrate and a recording layer on the transparent substrate, wherein
said recording layer comprises at least one Sb-based thin film and at least one reactive thin film,
said Sb-based thin film is in contact with said reactive thin film,
said Sb-based thin film is formed from an Sb-based material containing at least 95 at % of Sb,
said reactive thin film is formed from an In-Ag-Te-based material mainly comprising In, Ag and Te or In, Ag, Te and Sb, and
said reactive thin film contains 0.5 to 10 at % of oxygen.

(2) The optical recording medium according to the above (1) wherein said Sb-based thin film has a thickness of at least 7 nm.

(3) The optical recording medium according to the above (1) or (2) wherein total thickness of said Sb-based thin film(s) constitutes 30 to 70% of the thickness of the recording layer.

(4) The optical recording medium according to anyone of the above (1) to (3) wherein said Sb-based thin film is crystallized.

(5) The optical recording medium according to anyone of the above (1) to (4) wherein said In-Ag-Te-based material is represented by the following formula:

$$(In_x Ag_y Te_{1-x-y})_{1-z} Sb_z \qquad (I\text{-}1)$$

and atomic ratio of In, Ag, Te and Sb are such that:

$0.1 \leq x \leq 0.3$, $0.1 \leq y \leq 0.35$, and $0 \leq z \leq 0.5$.

(6) The optical recording medium according to anyone of the above (1) to (5) wherein
at least one of the Sb-based material and the In-Ag-Te-based material contains a metal M which is at least one element selected from the group consisting of H, Si, C, V, W, Ta, Zn, Ti, Ce, Tb, and Y; and said element M is present in the recording layer at a content of not more than 5 at % and said element M is present in the Sb-based layer at a content of not more than 5 at %.

(7) The optical recording medium according to anyone of the above (1) to (6) wherein at least one of the following four replacements:
partial replacement of Ag by Au,
partial replacement of Sb by Bi,
partial replacement of Te by Se,
partial replacement of In by Al and/or P has taken place.

(8) The optical recording medium according to anyone of the above (1) to (7) wherein number of the interfaces between the Sb-based thin film and the reactive thin film in the recording layer is up to 10.

(9) The optical recording medium according to anyone of the above (1) to (8) wherein the medium has reflectance immediately after the production ($R_O$); reflectance of the crystalline region of the recording layer after repeated recording ($R_C$); and minimum reflectance of the amorphous region of the recording layer after repeated recording ($R_A$) in the relation represented by:

$R_A < R_O \leq C_C$ when the reflectance is measured from the side of the transparent substrate.

(10) A method for producing an optical recording medium comprising a transparent substrate and a recording layer on the transparent substrate, wherein said recording layer comprises at least one Sb-based thin film and at least one reactive thin film, said Sb-based thin film is in contact with said reactive thin film, said Sb-based thin film is formed from an Sb-based material containing at least 95 at % of Sb, said reactive thin film is formed from an In-Ag-Te-based material mainly comprising In, Ag and Te or In, Ag, Te and Sb, and said reactive thin film contains 0.5 to 10 at % of oxygen, wherein
said Sb-based thin film is formed by sputtering, and the sputtering is conducted by introducing an inert gas into the sputtering chamber, and
said reactive thin film is formed by sputtering, and the sputtering is conducted by introducing an inert gas and oxygen gas into the sputtering chamber.

(11) The method for producing an optical recording medium according to the above (10) wherein said reactive thin film is formed by introducing the oxygen gas at a flow rate which is 2 to 30% of that of the inert gas.

(12) The method for producing an optical recording medium according to the above (10) or (11) wherein said Sb-based thin film has a thickness of at least 7 nm.

(13) The method for producing an optical recording medium according to anyone of the above (10) or (12) including the step of a mixing treatment wherein the material constituting the Sb-based thin film and the material constituting the reactive thin film are mixed by irradiating the recording layer with a continuous laser beam after the formation of the recording layer.

(14) The method for producing an optical recording medium according to the above (13) wherein linear velocity $V_M$ of the recording layer in relation to the laser beam in the mixing treatment and linear velocity $V_W$ of the recording layer in relation to the laser beam in the overwriting are controlled such that:

$0.2 V_W \leq V_M$

(15) The method for producing an optical recording medium according to the above (14) wherein $V_W$ and $V_M$ are controlled such that:

$V_W \leq V_M$

(16) The method for producing an optical recording medium according to anyone of the above (10) to (15) including the step of heat treating the medium at a temperature in the range of 60 to 120° C. immediately after the formation of the recording layer.

(17) The method for producing an optical recording medium according to anyone of the above (10) to (16) wherein the sputtering of the Sb-based thin film is conducted by introducing an inert gas in the sputtering chamber after evacuating to $0.5 \times 10^{-2}$ Pa or less.

(18) The method for producing an optical recording medium according to anyone of the above (10) to (17) wherein the optical recording medium of anyone of the above (1) to (9) is produced.

DETAILED DESCRIPTION OF THE INVENTION

Figure 1:
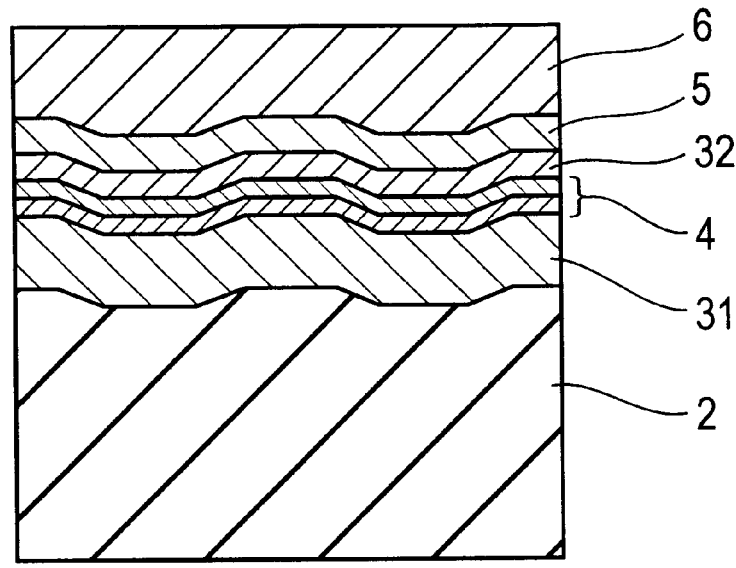
FIG. 1 is a partial cross-sectional view of an embodiment of the optical recording medium according to the present invention.

In the conventional recording media of phase change type, initialization (crystallization) is effected by heating and gradually cooling the single layer amorphous recording layer formed by sputtering. After such initialization, laser beam is directed to particular regions of the medium for overwriting. The recording layer of the regions treated with the recording power melt, and through the subsequent quenching, become amorphous or microcrystalline. The reflectance is thereby reduced and the recording marks are formed. In contrast, the regions treated with the erasing power undergo no change, and the reflectance immediately after the initialization is maintained. In the subsequent overwriting, the regions where the record marks are to be formed are treated with the recording power, and other regions are treated with the erasing power. The regions treated with the recording power turn into the record marks which are either amorphous or microcrystalline with no exception irrespective of whether the regions were crystalline, amorphous, or microcrystalline before the irradiation. The regions treated with the erasing power become crystalline with no exception. The medium is ready for further overwriting.

On the other hand, the optical recording medium of the present invention is prepared by disposing the Sb-based thin film and the reactive thin film. In most cases, mixing treatment is conducted after the formation of the recording layer. In the mixing treatment, the recording layer is irradiated with laser beam to heat and mix the elements constituting the Sb-based thin film and the elements constituting the reactive thin film. The recording layer which experienced such mixing treatment comprises Sb crystalline phase having dispersed therein amorphous phase such as Ab-Sb-Te. The reflectance of the recording layer which is relatively high owing to the crystallized Sb-based thin film before the mixing treatment reduces by the mixing treatment. The reflectance after the mixing treatment, however, is higher than that of the amorphous region (record marks).

The mixing treatment is similar to the initialization of the conventional recording medium of phase change type in that the recording layer as formed is brought into recordable state. The difference is that, while the conventional initialization is associated with an increase in the reflectance by the crystallization of the recording layer, the mixing treatment of the present invention is associated with the decrease in the reflectance since the recording layer treated comprises Sb crystalline phase having dispersed therein amorphous phase.

After the mixing treatment, the medium will be subjected to the recording and the overwriting similar to those of the conventional phase change type recording media. In the regions irradiated with the recording power, the recording layer will be heated to melt and subsequently quenched to become amorphous or microcrystalline, and the record marks are thereby formed. On the other hand, in the regions irradiated with the erasing power, crystallization of the $AgSbTe_2$ and the like will take place and the reflectance is thereby increased. The subsequent overwriting operation is conducted as in the case of the conventional phase change type recording medium as described above.

In the present invention, the reflectance of the record marks and the crystalline regions after the first irradiation with the overwriting laser beam after the mixing treatment is equivalent with the reflectance of the corresponding regions after the second irradiation. In other words, the reflectance of the optical recording medium of the present invention is highly stable from the first recording and the first overwriting in contrast to the conventional optical recording media of phase change type wherein single layer amorphous recording layer is initialized and the optical recording media of JP-A 47822/1995 and 106647/1996.

In the optical recording medium of the present invention, reflectance $R_O$ of the as formed recording layer (before the initialization); reflectance $R_C$ of the crystalline region (erased region) of the recording layer after repeated recording, and minimum reflectance $R_A$ of amorphous region (record mark) of the recording layer after repeated recording are generally in the relation:

$$R_A > R_O \leq R_C$$

The reflectances are the values obtained by measuring from the side of the substrate. The minimum reflectance $R_A$ of the amorphous region is the value measured when the recording layer became most amorphous to show the lowest reflectance. The reflectance $R_O$ of the recording layer as formed is generally lower than the reflectance $R_C$. In the present invention, however, $R_O$ is relatively high owing to the crystallized Sb thin film as described above. For example, $R_O$ may be about 60% of $R_C$ or higher. It is such level of the $R_O$ that enables precise control of the focusing of the laser beam in the mixing treatment to thereby enable uniform mixing treatment. When the reactive thin film is also crystallized, $R_O$ may be further increased to the level equivalent to $R_C$ by optimizing the composition, the thickness, and the like of both thin films and by optimizing the material, quality, thickness, and the like of the dielectric layer and the reflective layer which are formed on the surface of the recording medium together with the recording layer. The mixing treatment may be eliminated in such a case.

As described below, the mixing treatment of the present invention can be conducted at a linear velocity of the medium higher than that of the conventional initialization, and increase in the productivity is thereby enabled.

In the conventional initialization, the single layer, amorphous recording layer formed by sputtering is heated and gradually cooled for crystallization. Such process of heating the recording layer followed by gradual cooling is also conducted upon erasure (crystallization) of the amorphous record marks in the overwriting of the phase change type recording medium. The recording layer as formed and the record marks share the common feature that they are amorphous. The energy state, however, is different, and a higher energy is required for the initialization. Accordingly, a lower linear velocity is required. A lower linear velocity is also required to lower the cooling rate of the medium. If the linear velocity capable of attaining the erasability of −25 dB or less upon overwriting is defined as the overwritable linear velocity, and the linear velocity capable of attaining the best erasability is defined as the optimal velocity, the linear velocity required for the initialization is about ⅓ to ½ of the overwritable optimal linear velocity. Accordingly, the initialization by the laser beam irradiation is quite time consuming.

In contrast, in the present invention, the linear velocity $V_M$ of the recording layer in relation to the laser beam in the mixing treatment and the overwritable optimal linear velocity $V_W$ after the mixing treatment can be such that:

$$V_W \leq V_M$$

Therefore, the time required for the mixing treatment will be significantly shorter than the time required for the conventional initialization. The linear velocity $V_M$ can be increased by increasing the laser beam power used in the mixing treatment. There is no particular upper limit for the $V_M$. However, $V_M$ is generally in such range:

$$V_M \leq 5 V_W$$

when the mixing treatment is carried out with a bulk eraser or a recording system commonly used in the art.

When the linear velocity $V_M$ used in the mixing treatment is reduced, the mixing treatment can be accomplished with a laser beam of lower power. Therefore, when the mixing treatment is conducted at a linear velocity equivalent with the conventional initialization, the power of the laser beam used can be markedly reduced. However, it is preferable that: $V_W$ is generally in such range:

$$0.2 V_W \leq V_M$$

to accomplish the mixing treatment at a practical speed.

In the present invention, the recording layer is formed by sputtering. The Sb-based thin film is formed by introducing an inert gas such as argon into the sputtering chamber, and the reactive thin film is formed by introducing oxygen gas in addition to the inert gas into the sputtering chamber. The recording layer will then include the oxygen, and the number of the overwritable operations is thereby increased.

The reason why the oxygen introduction into the film forming atmosphere results in the significant increase in the number of the overwritable operations is yet to be found out. However, it is believed that such increase is realized by suppression of segregation of the recording layer and diffusion of the elements from the dielectric layer to the recording layer through the repeated overwriting operations.

The main reason for introducing the oxygen only in the reactive thin film and not in the Sb-based thin film is the prevention of the crystallization of the Sb-based thin film from being inhibited. Sb crystallizes at a high speed. At the same time, however, crystallization of the Sb is easily inhibited by impurities, and if the oxygen gas were introduced in the sputtering atmosphere in the formation of the Sb-based thin film, crystallization will not smoothly proceed and the film formed will be amorphous. When the Sb-based thin film formed is amorphous, the merit of facilitating or eliminating the initialization as described above will never be realized. On the bases of such finding, the present invention has simultaneously realized the merit of preventing the loss of productivity associated with the initialization, and the merit of increasing the number of overwritable operations by introducing the oxygen gas into the sputtering chamber only in the formation of the reactive thin layer.

The action as described below is also believed to be involved in the increase in the number of the overwritable operations. When the In-Ag-Te-Sb-based recording layer is crystallized by directing the erasing power, presence of the Sb microcrystalline phase in addition to the AbSbTe$_2$ crystalline phase is necessary for the increase of the reflectance and the increase of the erasability. In the conventional method wherein the single layer amorphous recording layer is initialized, Sb microcrystals are not formed before the initialization, and Ag readily diffuses into the Ag microcrystals. Repeated overwriting operations further promote such Ag diffusion to suppress the function of the Sb microcrystals. As a consequence, the erasability decreases with the repeated overwriting operations. In the present invention, when the reactive thin film is mixed with the crystallized Sb-based thin film, Ag forms stable compounds such as Ag-Te and AgSbTe$_2$ before being mixed with the Sb phase. As a consequence, Ag does not readily diffuse into the Sb microcrystals, and the erasability is only slightly reduced even after repeated overwriting operations, and the oxygen introduced in the reactive thin film is believed to suppress the diffusion of the Ag into the Sb microcrystals.

PREFERRED EMBODIMENTS OF THE INVENTION

Next, the present invention is described in further detail by referring to the preferred embodiments of the invention.

The optical recording medium of the present invention comprises a transparent substrate and a recording layer on the transparent substrate, and the recording layer comprises at least one antimony (Sb)-based thin film and at least one reactive thin film. In the recording layer, the Sb-based thin film is in contact with the reactive thin film.

Recording layer

The Sb-based thin film is formed from an Sb-based material containing 95 at % or more of Sb, and preferably 97 at % or more of Sb. When the Sb-based thin film has an insufficient Sb content or an insufficient thickness, the Sb-based thin film will not be sufficiently crystallized, and the merit of facilitating the initialization will not be realized.

The reactive thin film is formed from an indium (In)-silver (Ag)-tellurium (Te)-based material by such means as sputtering. The In-Ag-Te-based material is a material which mainly comprises In, Ag and Te or In, Ag, Te and Sb, and which will form a phase change material by mixing with Sb.

In the In-Ag-Te-based material, the atomic ratio of indium, silver, tellurium, and antimony is preferably represented by the formula (I-1):

$$(In_xAg_yTe_{1-x-y})_{1-z}Sb_z \qquad (I-1)$$

wherein letters x, y and Z are in the range: $0.1 \leq x \leq 0.3$, $0.1 \leq y \leq 0.35$, and $0 \leq z \leq 0.5$, and more preferably in the range: $0.1 \leq x \leq 0.28$, $0.15 \leq y \leq 0.35$, and $0.1 \leq z \leq 0.5$, and still more preferably in the range: $0.2 \leq z \leq 0.4$.

If the value of x is too small in formula (I-1), the indium content of the recording layer will be relatively too low and record marks will become less amorphous, resulting in a lower degree of modulation and lower reliability. If the value of x is too large, the indium content of the recording layer will be relatively too high and the reflectance of regions other than record marks will become low, resulting in a lower degree of modulation.

If the value of y is too small in formula (I-1), the silver content of the recording layer will be relatively too low and the recrystallization of record marks and hence, repetitive overwriting will become difficult. If the value of y is too large, the silver content of the recording layer will be relatively too high and excess silver will solely diffuse into the antimony phase during the mixing treatment. This results in lower rewriting durability, less stability of both the record marks and the crystalline regions, and a loss of reliability. Specifically, when the medium is stored at an elevated temperature, record marks crystallize more to invite drops of C/N and degree of modulation. Additionally, the deterioration of C/N and degree of modulation caused by repetitive recording is promoted.

If the value of x+y is too small in formula (I-1), tellurium will be excessive to form a tellurium phase, which lowers the rate of crystal transition to hinder erasure. If the value of x+y is too large, it will be difficult to make the recording layer amorphous and it will be impossible to record signals.

If the value of z is too large, it will also be difficult to make the recording layer amorphous and it will be impossible to record signals. Although z may be 0, antimony is preferably present in the above-specified range of z since antimony present in the reactive thin film contributes for the increase in the overwriting durability. When z is within the optimal range, crystallization temperature of the recording layer is in its minimum, and the recording layer undergoes crystallization during its formation. The energy required for the mixing treatment will then be significantly low, or alternatively, sufficiently stable overwriting is enabled even without the mixing treatment. It should be noted that, even if the crystallization took place simultaneously with its formation, the Sb-based film and the reactive thin film will not be mixed with each other, and both thin films will be present as independent crystallized films.

The reactive thin film contains 0.5 to 10 at % of oxygen, and preferably, 2 to 6 at % of oxygen. When the oxygen content is too low, the number of overwritable operation can not be sufficiently increased, while an excessively high oxygen content invites reduction of the erasure degree.

The Sb-based thin film and/or the reactive thin film preferably contains element M. The element M is at least one element selected from the group consisting of H, Si, C, V, W, Ta, Zn, Ti, Ce, Tb, and Y. The element M is effective in improving the overwriting durability, and more specifically, in restraining the erasability from lowering as a result of repeated overwriting. It is also effective in improving reliability under severe conditions such as hot humid conditions. At least one of V, Ta, Ce and Y is preferred among the elements M because their effects are more outstanding. V and/or Ta is more preferred, with V being the most preferred.

The content of the element M in the total recording layer is preferably 5 at % or less, and more preferably, 3 at % or less. If the content of element M is too large, change of reflectance associated with a phase change becomes too small to provide a sufficient degree of modulation. The content of the element M in the recording layer is preferably 0.5 at % or more to reliably realize the effects as described above.

When Sb-based material contains the element M, the content of the element M in the Sb-based material is 5 at % or less, and preferably, 3 at % or less. If the content of element M in the Sb-based material is too high, the Sb-based thin film will not be crystalline and the merits of the present invention will not be realized. The Sb-based thin film preferably comprises substantially Sb alone, or Sb and the element M.

The thickness of the Sb-based thin film and the reactive thin film may be adequately determined in accordance with the composition of the thin films such that the recording layer may have desired composition after the mixing of both thin films.

The thickness of the Sb-based thin film, however, is preferably at least 7 nm, and more preferably, at least 8 nm. When the Sb-based thin film is too thin, the Sb-based thin film will be rather amorphous and will not form a uniform crystalline film, and the merit of facilitating the initialization will not be realized.

When the Sb-based thin film is too thick, thickness of the reactive thin film should also be increased, and the recording layer will also be thick. The light absorption of the recording layer will then be increased and it will be difficult to attain high reflectance and degree of modulation will be low. The thickness of the Sb-based thin film is preferably 15 nm or less, and more preferably, 11 nm or less.

The thickness of the reactive thin film corresponding to such thickness of the Sb-based thin film is preferably 2.5 to 10 nm, and more preferably, 3 to 9 nm. When the reactive thin film is thin, the film formed may become discontinuous and fragmented. The reactive thin film, however, may not necessarily be continuous.

It should be noted that the thickness of the thin films are described herein in terms of the values calculated by multiplying film deposition rate by film deposition period.

The recording layer may comprise one Sb-based thin film and one reactive thin film. However, when the recording layer comprises three or more thin films, the overwriting durability is markedly improved and the energy required for the mixing may be reduced. When the recording layer comprises three or more thin films, the recording layer may either comprise the thin films of an even number wherein the Sb-based thin films and the reactive thin films are alternately deposited, or the thin films of an odd number wherein the uppermost and the lowermost thin films are the same type of the thin films. The recording layer, however, may most preferably comprise the Sb-based thin film(s) sandwiched by the reactive thin films. When the recording layer is of such constitution and all of the Sb-based thin films are sandwiched by the reactive thin films, the mixing between the materials constituting both thin films will proceed rapidly and uniformly, and less energy will be required for the mixing.

It should be noted that the number of interfaces in the recording layer between the Sb-based thin films and the reactive thin films is preferably up to ten since too many thin films will result in an excessively increased thickness of the recording layer.

In the recording layer (the Sb-based thin film(s) plus the reactive thin film(s)), the atomic ratio of the constituent elements (excluding the oxygen) is preferably represented by the formula (I-2):

$$[(In_a Ag_b Te_{1-a-b})_{1-c} Sb_c]_{1-d} M_d \qquad (I\text{-}2)$$

wherein letters a, b, c and d are in the range: $0.1 \leq a \leq 0.3$, $0.1 \leq b 0.35$, $0.45 \leq c \leq 0.8$, and $0 \leq d \leq 0.05$, and more preferably, in the range: $0.1 \leq a \leq 0.28$, $0.15 \leq b \leq 0.35$, $0.53 \leq c \leq 0.75$, and $0.005 \leq d \leq 0.05$.

a and b are limited to the ranges as described above for the reason the same as the reason why x and y are limited to the corresponding ranges in the formula I-1, above. The reason for the limitation of d, namely the content of the element M, is also the same as the one as described above.

If the value of c is too small in formula (I-2), change of reflectance associated with a phase change will be sufficient, but erasure will be difficult due to markedly reduced rate of crystal transition. If the value of c is too large, change of reflectance associated with the phase change will be insufficient to invite drop in the degree of modulation.

Although it is preferred that the recording layer consists essentially of silver (Ag), antimony (Sb), tellurium (Te), indium (In), and optionally added M, it is acceptable that the silver is partially replaced by gold (Au); the antimony is partially replaced by bismuth (Bi); the tellurium (Te) is partially replaced by selenium (Se); and the indium (In) is partially replaced by aluminum (Al) and/or phosphorus (P).

The percent replacement of Ag by Au is preferably up to 50 at %, more preferably up to 20 at %. With a higher percent replacement, record marks are likely to crystallize, leading to a loss of reliability at elevated temperature.

The percent replacement of Sb by Bi is preferably up to 50 at %, more preferably up to 20 at %. With a higher percent replacement, the recording layer will have an increased coefficient of absorption. As a result, the optical interference effect and the difference in reflectance between crystalline and amorphous regions are reduced, leading to a lower degree of modulation and a lower C/N.

The percent replacement of Te by Se is preferably up to 50 at %, more preferably up to 20 at %. With a higher percent replacement, the crystal transition will be retarded and the erasability will be reduced.

The percent replacement of In by Al and/or P is preferably up to 40 at %, more preferably up to 20 at %. With a higher percent replacement, record marks will become less stable with a resultant loss of reliability. The proportion of Al and P is arbitrary.

The recording layer may contain a minute amount of other elements such as Cu, Ni, Zn, Fe, N, C and the like as impurities. The total amount of such elements, however, is preferably up to 0.05 at %.

The composition of the recording layer is identifiable by electron probe microanalysis (EPMA), X-ray microanalysis, etc.

The thickness of the recording layer is preferably in the range of 9.5 to 50 nm, and more preferably, from 11 to 30 nm. When the recording layer is too thin, growth of the crystalline phase becomes difficult and change of reflectance with the phase change becomes insufficient. When the recording layer is too thick, a large amount of Ag will diffuse in the direction of the thickness of the recording layer upon formation of the record mark and the portion of the Ag that diffuses in the direction parallel to the recording layer will be reduced to result in poor reliability. An excessively thick recording layer also results in an excessively high light absorption by the recording layer.

Thickness of the Sb-based thin film (or thickness of the Sb-based thin films in total when two or more Sb-based thin film are provided) may preferably comprise 30 to 70% of the recording layer, and more preferably, 40 to 60% of the recording layer. When the proportion of the Sb-based thin film(s), namely, the proportion of Sb in the recording layer is too high, crystallization speed of the recording layer will be excessively high, and the region which should remain amorphous may undergo crystallization. This means that the record mark is not formed in the region where the record mark should have been formed, and the region is recognized as "blank" upon reading. An excessively high proportion of the Sb may also result in low reliability. On the other hand, when the proportion of the thickness of the Sb-based thin film(s) is too low, crystallization of the recording layer will be difficult, and the erasure of the record marks may be insufficient to result in the low erasability.

Formation of the recording layer

In the embodiments as described above, the Sb-based thin film and the reactive thin film are deposited by sputtering. The conditions of the sputtering are not particularly limited. For example, when a material containing two or more elements is sputtered, the sputtering may be conducted by using an alloy target, or alternatively, by multiple sputtering using two or more targets. The Sb-based thin film and the reactive thin film may be deposited in any order.

In the sputtering, the sputtering chamber (vacuum chamber) is first evacuated, and the gas constituting the sputtering atmosphere is then introduced to conduct the sputtering.

In the formation of the Sb-based thin film, an inert gas such as Ar, Kr, or Xe is used for the gas of the sputtering atmosphere. Use of Ar gas is preferable. In the formation of the reactive thin film, oxygen gas in addition to the inert gas as described above is used, and the ratio of the oxygen gas flow rate/inert gas flow rate is maintained at the rate preferably in the range of 2 to 30%, and more preferably, 8 to 20%. When the oxygen gas flow rate is too high in relation to the inert gas flow rate, the number of overwritable operation can not be sufficiently increased, and when the oxygen gas flow rate is too low in relation to the inert gas flow rate, erasability will be reduced.

The sputtering is generally conducted at a pressure of 0.1 to 1.0 Pa, and preferably at 0.1 to 0.5 Pa.

In the present invention, the pressure of the sputtering chamber before the introduction of the gas of the sputtering atmosphere (hereinafter referred to as "arrival gas pressure") for the sputtering chamber used in the formation of the Sb-based thin film is preferably adjusted to $0.5 \times 10^{-2}$ Pa or less, more preferably, to $0.2 \times 10^{-1}$ Pa or less, and most preferably, to $5 \times 10^{-4}$ Pa or less, and to the thus evacuated sputtering chamber is introduced the gas of the sputtering atmosphere to thereby conduct the sputtering. When the Sb-based thin film is formed under such conditions, formation of Sb microcrystals are promoted, and the crystallization necessary for the Sb-based thin film will be substantially completed at the stage when the Sb-based thin film and the reactive thin film are completed. Evacuation of the chamber to the arrival gas pressure of the range as specified above is effective for shortening the time required for the mixing treatment as describe above.

When the Sb-based thin film and the reactive thin film are formed in the same chamber, the thin films may be formed one after another after evacuating the chamber to the arrival gas pressure of the above-specified range. In other words, when the Sb-based thin film is formed after the reactive thin film, the chamber need not be re-evacuated to the above-specified range after the formation of the reactive thin film.

The crystallization of the Sb-based film can be promoted if the recording layer is heat treated after the formation of the recording layer. Therefore, the recording layer may be subjected to an optional heat treatment after the formation of the recording layer to thereby promote the crystallization. Such optional heat treatment is preferably conducted at a heat treatment temperature of 60 to 120° C. An excessively low heat treatment temperature will require an excessively long period for the crystallization. An excessively high heat treatment temperature will result in the damage of the substrate when the substrate is formed from a resin such as polycarbonate. The heat treatment period is not limited to any particular range so long as the heat treatment is continued until the reflectance is saturated. In view of productivity, the heat treatment is generally conducted for a period of up to 1 hour. Such heat treatment should be conducted immediately after the formation of the recording layer, and if mixing treatment is conducted, the heat treatment should be conducted before the mixing treatment.

Mixing treatment and overwriting

The mixing treatment and the overwriting of the optical recording medium of the present invention are performed as described above. The recording power may be applied in pulses. When one signal is recorded by at least two divided portions of irradiation, the heat accumulation in the record mark is suppressed, and then, the dilation of the trailing edge of the record mark (known as a teardrop phenomenon) can be prevented, leading to an improved C/N. The irradiation in pulses also improves the erasability. The values of the recording power and the erasing power used in practice can be determined without undue experimentation. The reading laser beam should be of a low power so that the crystalline state of the recording layer may not be affected thereby.

When the optical recording medium of the invention is recorded, the linear velocity of the recording layer in relation to the laser beam is generally about 0.8 to 20 m/s, preferably 1.2 to 16 m/s. Overwritable optimal linear velocity may be controlled by adjusting the Sb content of the recording layer. That is, the overwritable optimal linear velocity may be increased by increasing the Sb content.

The light used for the mixing treatment, overwriting and reading of the optical recording medium of the invention may be selected from the wavelength of a wide range, for example, 100 to 5,000 nm.

Optical recording medium of FIG. 1

An embodiment of the optical recording medium according to the present invention is shown in FIG. 1. This optical recording medium is a single side (single substrate) optical recording medium which has a first dielectric layer 31, a recording layer 4, a second dielectric layer 32, a reflective layer 5, and a protective layer 6 on a substrate 2. The present invention is applicable for a double side recording medium comprising two single side recording media which are adhered to each other by an intervening adhesive layer such that the protective layer 6 is located in the interior side of the resulting medium. The present invention is also applicable for a medium comprising the single side recording medium as described above adhered to a protective substrate by an intervening adhesive layer.

First dielectric layer 31, second dielectric layer 32

The first dielectric layer 31 plays the role of preventing oxidation of the recording layer 4 and protecting the substrate by shutting off the heat which can otherwise conduct from the recording layer to the substrate upon recording. The second dielectric layer 32 plays the role of protecting the recording layer and helps the heat remaining in the recording layer after completion of recording release through heat transfer. Further, the provision of both the dielectric layers is effective for improving a degree of modulation.

The dielectric layer used for the first and the second dielectric layer is not limited to any particular type, and various dielectric materials or a mixture thereof as well as various transparent ceramics such as silicon oxide, silicon nitride and ZnS-SiO$_2$ and various species of glass may be used. Also useful are so-called LaSiON materials containing La, Si, O, and N, so-called SiAlON materials containing Si, Al, O, and N, SiAlON containing yttrium, etc.

In the present invention, at least one of the first and the second dielectric layers may preferably contain zinc sulfide, ZnS for optimization of properties such as refractive index. The dielectric layer containing zinc sulfide is hereinafter referred to as ZnS-containing dielectric layer. The ZnS-containing dielectric layer may preferably contain an element whose standard free energy of sulfide formation is lower than the standard free energy of ZnS formation at 0 to 1000° C. (hereinafter referred to as metal element A). Incorporation of the metal element A in the ZnS-containing dielectric layer results in the suppressed release of sulfur upon repeated overwriting, and increase of jitter is thereby prevented. This results in the increased number of overwritable operations.

The metal element A is preferably at least one member selected from Ce, Ca, Mg, Sr, Ba and Na, and use of Ce is most preferable in view of the low standard free energy of sulfide formation. For example, at 300 K, the standard free energy of ZnS formation is about −230 kJ/mol, the standard free energy of CeS formation is about −540 kJ/mol, the standard free energy of CaS formation is about −510 kJ/mol, the standard free energy of MgS formation is about −390 kJ/mol, the standard free energy of SrS formation is about −500 kJ/mol, the standard free energy of BaS formation is about −460 kJ/mol, and the standard free energy of Na$_2$S formation is about −400 kJ/mol.

In the ZnS-containing dielectric layer, the ratio of the metal element A to the total metal elements is less than 2 at %, preferably 1.5 at % or less, and more preferably 1.3 at % or less. When the ratio of the metal element A is in excess of such range, the effect of suppressing jitter increase upon repeated overwriting is not realized. It should be noted that the ratio of the metal element A is preferably at least 0.01 at %, and more preferably at least 0.03 at % for sufficient realization of the metal element A addition. The ratio of the metal element A to the total metal elements may be determined by fluorescent X-ray analysis or EPMA (electron probe X-ray microanalysis). It should be noted that semimetal such as silicon is included in the "total metal elements" in the dielectric layer.

The metal element A in the dielectric layer may take form of simple substance, sulfide, oxide, fluoride, or the like.

The ZnS-containing dielectric layer may preferably contain compounds other than zinc sulfide, for example, an oxide, nitride or fluoride. Preferably, such compound is at least one member selected from silicon oxides (SiO$_2$, SiO), tantalum oxide (Ta$_2$O$_5$), titanium oxide (TiO$_2$), lanthanum oxide (La$_2$O$_3$), silicon nitride (Si$_3$N$_4$), aluminum nitride (AlN), magnesium fluoride (MgF$_2$), sodium fluoride (NaF) and thorium fluoride (ThF$_4$). When the dielectric layer is prepared from zinc sulfide alone, the dielectric layer is excessively hard, and heat impacts in the overwriting operations may result in delamination of the dielectric layer, leading to poor rewriting durability. Inclusion of silicon oxide, silicon nitride or the like invites improvement in the rewriting durability.

The content of the zinc sulfide in the ZnS-containing dielectric layer is preferably in the range of from 50 to 95 mol %, and more preferably from 70 to 90 mol %. When the content of the zinc sulfide is insufficient, heat conductivity will be too high and refractive index will be too low, and high C/N can not be obtained. On the other hand, an excessively high zinc sulfide content results in poor rewriting durability. The content of the zinc sulfide in the dielectric layer is calculated in terms of sulfur and zinc contents measured by fluorescent X-ray analysis or the like, and for example, when the zinc content measured is in excess of the sulfur content, the excess zinc is deemed to be present in the form of a compound other than zinc sulfide, for example, ZnO.

An embodiment wherein the metal element A is added to the ZnS-containing dielectric layer has been described in the foregoing. Alternatively, an intermediate layer containing the metal element A may be disposed between the ZnS-containing dielectric layer and the recording layer. Examples of such intermediate layer include the layer containing cerium oxide (CeO$_2$) as simple substance, and the layer containing a mixture of ZnS-CeO$_2$ mixture.

When either one of the first and the second dielectric layers is the ZnS-containing dielectric layer, the dielectric material used for the other dielectric layer, namely, the dielectric layer containing no ZnS is not limited to any particular type, and the dielectric materials as mentioned above other than the zinc sulfide or a mixture thereof may be used.

The lower and the upper dielectric layers may preferably have a refractive index of at least 1.4, especially at least 1.8 in the wavelength range of 400 to 850 nm. This wavelength range covers 780 nm which is the wavelength used in current CD players and 630–680 nm which is a candidate wavelength of the next generation recording technology and represents the range over which the optical recording medium having the recording layer as described below is advantageously operated.

The first dielectric layer 31 is preferably about 30 to 300 nm thick, more preferably 50 to 250 nm thick. Within this thickness range, the first dielectric layer is effective for preventing any damage to the substrate upon recording and higher degree of modulation is available. The second dielectric layer 32 is preferably about 10 to 30 nm, more preferably about 13 to 20 nm thick. This thickness range ensures a fast cooling rate and thus permits to define a record mark with a clear edge, resulting in reduced jitter. Also higher degree of modulation is available.

The dielectric layers are preferably formed by vapor deposition such as sputtering and evaporation, and the metal element A may be incorporated in the dielectric layer by various methods. For example, when the metal element A is cerium, a chip comprising cerium as simple substance or CeO$_2$ may be placed on the main target comprising the main components of the dielectric layer, or alternatively, cerium may be incorporated in the main target in the form of CeO$_2$ or other Ce compounds. When calcium or magnesium is used for the metal element A, it is possible to place a chip comprising CaO or MgO. Such oxides, however, have deliquescence, and use of such chip is undesirable. In such a case, a chip comprising CaF$_2$ or MgF$_2$ may be placed on the main target. The situation is similar when strontium, barium, sodium and the like are used for the metal element A, and use of fluoride chip is more preferable than oxide chip in view of the deliquescence. Alternatively, calcium, magnesium, strontium, barium, and sodium may be incorporated in the main target in the form of oxide or other compounds. The main target may comprise a multicomponent target such as ZnS-SiO$_2$, or alternatively, ZnS and SiO$_2$ may be separately used for the main targets in simultaneous sputtering.

The ZnS-containing dielectric layer may be deposited by conventional sputtering in argon atmosphere. However, when the metal element A as described above is incorporated in the ZnS-containing dielectric layer, the sputtering is preferably effected in a mixed atmosphere of argon and oxygen. The sputtering in such mixed atmosphere enhances the effect of suppressing jitter increase upon repeated overwriting. Introduction of the oxygen into the sputtering atmosphere is particularly effective when the sputtering is conducted by placing the chip comprising the metal element A as simple substance on the main target, but such oxygen introduction is also effective when the sputtering is conducted by placing the chip comprising the compound of the metal element A on the main target or by incorporating the compound of the metal element A in the main target. The amount of oxygen introduced into the sputtering atmosphere in terms of flow rate ratio O$_2$/(Ar+O$_2$) is preferably 30% or less, and more preferably 25% or less. Excessive introduction of the oxygen is undesirable since the recording power decreases with no difference in the erasing power, and the erasing power margin will be extremely narrow. The oxygen is preferably introduced to a flow rate ratio of 5% or higher, and more preferably, to a flow rate ratio of 10% or higher in order to fully enjoy the effects of oxygen introduction.

Reflective layer 5

The reflective layer 5 may be formed from any desired material, and typically, the reflective layer 5 is formed from a metal of high reflectance such as Al, Au, Ag, Pt, or Cu as a simple substance or as an alloy containing at least one of such metals. The reflective layer is preferably about 30 to 200 nm thick. Reflectance will be insufficient with a thickness below this range. A thickness beyond this range will provide no substantial improvement in reflectance and add to the cost. The Reflective layer is preferably formed by vapor deposition such as sputtering and evaporation.

Protective layer 6

The protective layer 6 is provided for improving scratch resistance and corrosion resistance. Preferably the protective layer is formed of an organic material, typically a radiation curable compound or a composition thereof which is cured with radiation such as electron and UV radiation. The protective layer is generally about 0.1 to 100 μm thick and may be formed by conventional techniques such as spin coating, gravure coating, spray coating, and dipping.

Adhesive layer

The adhesive used for the adhesive layer is not limited to any particular type, and the adhesive may be a hot melt adhesives, a UV curing adhesive, or a room temperature curing adhesive, or alternatively, a pressure sensitive adhesive.

Figure 2:
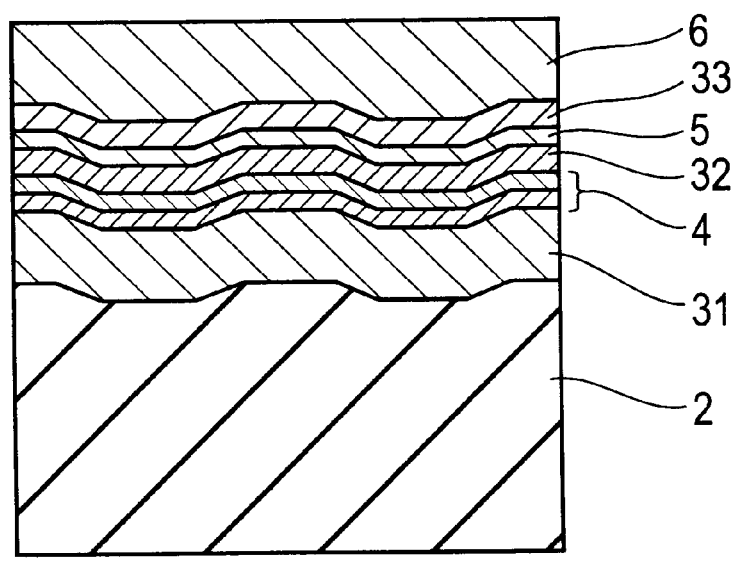
FIG. 2 is a partial cross-sectional view of another embodiment of the optical recording medium according to the present invention.

Optical recording medium of FIG. 2

Referring to FIG. 2, there is illustrated another embodiment of the optical recording medium according to the present invention. The optical recording medium of this structure has been fabricated for the purpose of suppressing increase of jitter upon overwriting.

The optical recording medium of phase change type utilizes difference in reflectance between the crystalline and the noncrystalline state, and light absorption (Ac) of the recording layer in the region other than recording marks (in crystalline state) and the light absorption (Aa) of the recording layer in the recording marks (in noncrystalline state) are often different, and the Ac<Aa is the condition generally found in such situation. Recording sensitivity and eraseability are thus different depending on whether the region overwritten is crystalline or noncrystalline, and consequently, the record marks of different length and width are formed by the overwriting to invite increase in the jitter often resulting in errors. When mark edge recording wherein the information is encoded in opposite edges of the record marks is adopted for increasing the recording density, variation in the length of the record marks has greater significance and such variation invites increased errors. In order to solve such a situation, the absorption should be adjusted to Ac=Aa, or Ac>Aa in consideration of the latent heat, by regulating the thickness of the recording layer or the dielectric layers sandwiching the recording layer. In the medium of conventional structure, the adjustment to Ac≧Aa results in reduced difference between the reflectance (Rc) of the medium of the region other than the record marks and the reflectance (Ra) of the medium in the record marks, and hence, in a reduced C/N.

JP-A 124218/96 proposes an optical information recording medium comprising a substrate, a first dielectric layer, a recording layer, a second dielectric layer, a reflective layer, a third dielectric layer, and a UV curing resin layer disposed in this order wherein Ac>Aa, and an extremely thin film of a metal of high light transmission or a layer of silicon or germanium is used for the reflective layer, and a dielectric material having a refractive index of higher than 1.5 is used for the third dielectric layer. Increase in Ac/Aa is achieved without detracting from the high (Rc-Ra) by providing the reflective layer of high light transmission and the third dielectric layer of high refractive index.

The optical recording medium of FIG. 2 is a single side recording medium wherein the reflective layer 5 is of the constitution as in the case of JP-A 124218/96, and wherein a third dielectric layer 33 is disposed between the reflective layer 5 and the protective layer 6. The substrate 2, the first dielectric layer 31, the recording layer 4, the second dielectric layer 32, and the protective layer 6 are of the constitution as in the case of the optical recording medium of FIG. 1. As in the case of the single side recording medium of FIG. 1, the optical recording medium of FIG. 2 may be adhered with another such medium to form a dual side recording medium, or alternatively, the medium may be adhered to a protective substrate.

In the medium of FIG. 2, the reflective layer 5 may comprise an extremely thin film of a metal of high light transmission or a layer of silicon or germanium having a high transmission for the light of near infrared to infrared region including the recording/reproducing wavelength. The thickness of the reflective layer may be adequately determined to enable the absorption correction between the region other than the record marks and the record marks as described above. The range of the preferable thickness of the reflective layer is significantly different by the material constituting the reflective layer, and the thickness may be determined in accordance with the material. When a metal such as Au is used for the reflective layer, the reflective layer may preferably have a thickness of up to 40 nm, and more preferably 10 to 30 nm. When Si or Ge is used for the reflective layer, the reflective layer may preferably have a thickness of up to 80 nm, and more preferably from 40 to 70 nm. A thickness below this range will invite decline of C/N, and a thickness beyond this range will provide no substantial improvement in the absorption coefficient control effect.

When the reflective layer 5 is formed from a metal, the reflective layer may preferably comprise Au or an alloy thereof. The Au alloy may comprise the main component of Au and at least one alloying component selected from Al, Cr, Cu, Ge, Co, Ni, Mo, Ag, Pt, Pd, Ta, Ti, Bi and Sb.

The reflective layer 5 is preferably formed by vapor deposition such as sputtering and evaporation.

The third dielectric layer 33 optionally formed on the reflective layer 5 is preferably formed from a material which has a refractive index higher than the protective layer 6. By providing such third dielectric layer 33, the Ac/Aa as described above can be increased while maintaining the difference in reflectance between the record marks and the region other than the record marks at a sufficient level as in the case of JP-A 124218/96.

The third dielectric layer 33 may be formed from a material selected from those described for the first and second dielectric layers. The third dielectric layer, however, is not in direct contact with the recording layer, and therefore, does not necessarily contain the metal element A as described above.

The third dielectric layer may preferably have a thickness of 30 to 120 nm, and more preferably 40 to 90 nm. An excessively thin third dielectric layer results in the decline of the signal output, and an excessively thick third dielectric layer results in the erasure of the signals in the adjacent track (cross erasure).

EXAMPLES

Examples of the present invention are given below by way of illustration and not by way of limitation.

Example 1

Optical recording disc samples of the constitution as shown in Table 1 were prepared by the procedure as described below.

A disc shaped substrate 2 having a diameter of 120 mm and a thickness of 0.6 mm was prepared by injection molding polycarbonate. A groove was formed in one major surface of the substrate simultaneous with the injection molding. The groove had a width of 0.74 μm, a depth of 65 nm, and a pitch of 1.48 μm. On the grooved surface of the substrate, there were formed a first dielectric layer 31, a recording layer 4, a second dielectric layer 32, a reflective layer 5, and a protective layer 6 to produce the optical recording disc sample of the constitution as depicted in FIG. 1.

The first dielectric layer 31 was formed by using ZnS and $SiO_2$ for the target. $SiO_2/(ZnS+SiO_2)$ was 15 mol %. The first dielectric layer 31 was deposited to a thickness of 220 nm.

Next, after evacuating the vacuum chamber of the sputtering system to $0.04 \times 10^{-2}$ Pa, and introducing argon gas to $5 \times 10^{-1}$ Pa, the Sb-based thin film (Sb, 100%) was formed by sputtering. Argon gas and oxygen gas were then introduced into the vacuum chamber, and the reactive thin film was formed by sputtering to complete the recording layer. The reactive thin film was formed at the $O_2/Ar$ gas flow rate ratio shown in Table 1. The reactive thin film formed had the composition (excluding oxygen) of $(Ag_{0.31}In_{0.12}Te_{0.57})_{0.78}Sb_{0.22}$ by atomic ratio. The composition was determined by ICP. The reactive thin film was evaluated for its oxygen content by Auger electron spectroscopy. The results are shown in Table 1. The proportion of the thickness of the Sb-based thin film in the total thickness of the recording layer is also shown in Table 1. The total thickness of the recording layer was 17 nm.

The recording layer was evaluated for the crystallographic state by electron beam diffraction. It was then confirmed that the Sb-based thin film was in crystalline state while the reactive thin film was in amorphous state.

The second dielectric layer 32 was formed to a thickness of 15 nm by the same procedure as the first dielectric layer 31.

The reflective layer 5 was formed to a thickness of 100 nm by sputtering an Al target.

The protective layer 6 was formed by applying a UV curable resin by spin coating and exposing it to UV for curing. The protective layer as cured had a thickness of 5 μm.

The thus prepared optical recording disc samples were initialized by an optical recording medium evaluator (DDU 1000, manufactured by Pulstec Industrial Co., Ltd.; laser wavelength, 638 nm; numerical aperture, 0.6) at the sample linear velocity of 2 m/s and the laser beam power of 8 mW.

Next, C/N, erasability, and jitter were evaluated by using the optical recording medium evaluator as described above. The C/N and the erasability were evaluated by using single signals repeating only the mark blank of 3T (102.8 ns) and single signals of 14T (479.8 ns). The jitter was evaluated by using mixed signals of 3T to 14T. The linear velocity of the sample was 6 m/s, and the laser power used in the recording and the erasure is shown in Table 1. The read laser power was 1 mW. The C/N, the erasability, and the jitter (maximum value) of each sample were measured after 10 overwriting operations, and the results are shown in Table 1 as "initial" values. The overwriting operation was repeated, and similar measurements were conducted after 1000, 2000, 5000, and 10,000 overwriting operations, and at every 10,000 operations after the 10,000 operations. The number of overwritable operations for each sample is shown in Table 1. The term "number of overwritable operations" as used herein is the maximum number of overwritable operations wherein the maximum jitter measured after the above-described repeated overwriting operations is 7 ns or less. The C/N, the erasability, and the jitter (maximum value) after the overwriting operations of the number shown in the Table as the number of overwritable operations are also shown in Table 1 as the values "after OW".

TABLE 1

| | | | | | | |
|---|---|---|---|---|---|---|
| (Initialization conducted) | | | | | | |
| | $O_2/Ar$ flow | Oxygen | Proportion | (%) Laser power | C/N (dB) | |
| Sample No. | rate ratio (%) | content (at %) | of Sb-based thin film | (mW) recording/erasure | 3T Initial/After OW | 14T Initial/After OW |
| 101* | 0 | 0 | 54 | 11.5/5.0 | 51/50 | 49/39 |

TABLE 1-continued (Initialization conducted)

| | | | | | | |
|---|---|---|---|---|---|---|
| 102 | 2 | 0.56 | 54 | 11.5/4.5 | 51/49 | 53/43 |
| 103 | 6 | 1.57 | 54 | 11.0/4.5 | 54/52 | 50/44 |
| 104 | 8 | 2.3 | 54 | 11.0/4.5 | 52/49 | 54/45 |
| 105 | 10 | 2.45 | 54 | 11.0/4.5 | 52/53 | 54/53 |
| 106 | 15 | 4.14 | 54 | 11.0/4.5 | 50/51 | 47/47 |
| 107 | 20 | 5.35 | 54 | 11.0/4.5 | 51/48 | 45/43 |
| 108 | 30 | 8.23 | 54 | 11.0/4.5 | 53/50 | 41/46 |
| 109* | 40 | 11.21 | 54 | 11.0/4.5 | 50/51 | 38/49 |
| 110* | 0 | 0 | 30 | 10.0/4.0 | 52/48 | 56/40 |
| 111* | 0 | 0 | 40 | 10.0/4.0 | 54/50 | 58/42 |
| 112* | 0 | 0 | 70 | 12.0/4.5 | 48/44 | 43/36 |
| 113 | 10 | 2.45 | 30 | 10.0/4.0 | 52/55 | 53/56 |
| 114 | 10 | 2.45 | 40 | 10.0/4.0 | 53/55 | 55/56 |
| 115 | 10 | 2.45 | 70 | 11.5/4.5 | 47/50 | 49/50 |

| | Erasability (dB) | | Jitter max. value | Number of |
|---|---|---|---|---|
| Sample No. | 3T Initial/After OW | 14T Initial/After OW | (ns) Initial/After OW | overwritable operations |
| 101* | 32/33 | 34/32 | 3.3/5.3 | 2,000 |
| 102 | 38/36 | 36/38 | 3.6/4.7 | 5,000 |
| 103 | 40/41 | 34/33 | 3.5/3.9 | 10,000 |
| 104 | 38/36 | 37/40 | 3.4/3.1 | 30,000 |
| 105 | 44/44 | 34/36 | 3.3/3.3 | >100,000 |
| 106 | 41/39 | 35/43 | 4.4/3.8 | >100,000 |
| 107 | 41/39 | 34/44 | 4.4/3.2 | >100,000 |
| 108 | 34/36 | 28/30 | 5.0/3.6 | >100,000 |
| 109* | 28/31 | 24/26 | 7.3/3.9 | >100,000 |
| 110* | 28/28 | 30/27 | 4.2/6.6 | 1,000 |
| 111* | 30/31 | 36/35 | 3.6/5.0 | 2,000 |
| 112* | 26/25 | 25/26 | 4.4/6.2 | 1,000 |
| 113 | 33/34 | 28/31 | 4.2/4.4 | >100,000 |
| 114 | 37/33 | 33/34 | 3.7/3.4 | >100,000 |
| 115 | 30/33 | 26/27 | 4.7/4.1 | >100,000 |

*Comparative

The data shown in Table 1 reveal that the optical recording medium prepared with the oxygen gas introduced during the formation of the reactive thin film for the purpose of controlling the oxygen content of the thin film to a predetermined range exhibits excellent initial properties as well as the C/N and the erasability of sufficient levels even after 100,000 overwriting operations. The sample prepared by such procedure also exhibited substantially no alteration in the jitter value, and no alteration in the power (reflection level of the crystalline portion) even after 100,000 overwriting operations. In contrast, Comparative Sample No. 101 prepared with no oxygen gas introduced during the formation of the reactive thin film underwent a marked decrease in C/N after repeated overwriting operations, and particularly, in the case of the 14T signal. It should be noted that, in this Comparative Sample No. 101, 5000 overwriting operations resulted in decrease in the reflection level to about 80% of the initial reflection, and the maximum jitter value after 5000 overwriting operations was 15.7 ns.

Example 2

Optical recording disc sample Nos. 201 and 202 as shown in Table 2 were prepared. Other samples shown in Table 2 are those prepared in Example 1.

The initialization of Example 1 was not conducted for these samples, and only the overwriting operations were conducted under the conditions of Example 1 for 10 times. The 10 overwriting operations correspond to the mixing treatment as described above. After the 10 overwriting operations, the optical recording disc samples were evaluated for their C/N, erasability, and jitter by repeating the procedure of Example 1. The results are shown in Table 2.

TABLE 2

(Initialization not conducted)

| | O₂/Ar flow | Oxygen | Sb-based thin film | | Laser power |
|---|---|---|---|---|---|
| Sample No. | rate ratio (%) | content (at %) | Thickness (nm) | Proportion (%) | (mW) recording/erasure |
| 201 | 10 | 2.45 | 4.3 | 25 | 10.0/4.0 |
| 113 | 10 | 2.45 | 5.1 | 30 | 10.0/4.0 |
| 114 | 10 | 2.45 | 6.8 | 40 | 10.0/4.0 |
| 105 | 10 | 2.45 | 9.2 | 54 | 11.0/4.5 |
| 115 | 10 | 2.45 | 11.9 | 70 | 11.5/4.5 |

TABLE 2-continued (Initialization not conducted)

| | | | | | |
|---|---|---|---|---|---|
| 202 | 10 | 2.45 | 12.8 | 75 | 11.5/4.5 |

| | C/N (dB) | | Erasability (dB) | | Jitter max. |
|---|---|---|---|---|---|
| Sample No. | 3T Initial | 14T Initial | 3T Initial | 14T Initial | value (ns) Initial |
| 201 | 45 | 44 | 24 | 19 | 7.0 |
| 113 | 47 | 49 | 30 | 23 | 5.4 |
| 114 | 48 | 50 | 32 | 24 | 4.7 |
| 105 | 52 | 52 | 37 | 30 | 3.8 |
| 115 | 49 | 49 | 31 | 29 | 4.6 |
| 202 | 45 | 48 | 25 | 22 | 6.7 |

As demonstrated in Table 2, in the optical recording disc of the present invention wherein the Sb-based thin film and the reactive thin film are deposited, the disc having the Sb-based thin film deposited to a thickness of 7 nm or more exhibits excellent properties by merely subjecting to 10 overwriting operations with no initialization treatment. In other words, the disc having the Sb-based thin film deposited to a thickness of 7 nm or more no longer requires the initialization at the low linear velocity. It is also evident from the results shown in Table 2 that the proportion of the thickness of the Sb-based thin film in the total thickness of the recording layer is preferably up to 70%.

The merits of the present invention should be apparent from the results of the Examples as described above.

Japanese Patent Application No. 155865/1997 is herein incorporated by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. An optical recording medium comprising a transparent substrate and a recording layer on the transparent substrate, wherein said recording layer comprises at least one Sb-based thin film and at least one reactive thin film, said Sb-based thin film is in contact with said reactive thin film, said Sb-based thin film is formed from an Sb-based material containing at least 95 at % of Sb, said reactive thin film is formed from an In-Ag-Te-based material mainly comprising In, Ag and Te or In, Ag, Te and Sb, and said reactive thin film contains 0.5 to 10 at % of oxygen.

2. The optical recording medium according to claim 1 wherein said Sb-based thin film has a thickness of at least 7 nm.

3. The optical recording medium according to claim 1 wherein total thickness of said Sb-based thin film(s) constitutes 30 to 70% of the thickness of the recording layer.

4. The optical recording medium according to claim 1 wherein said Sb-based thin film is crystallized.

5. The optical recording medium according to claim 1 wherein said In-Ag-Te-based material is represented by the following formula:

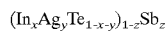 (I-1)

and atomic ratio of In, Ag, Te and Sb are such that:

$0.1 \leq x \leq 0.3$, $0.1 \leq y \leq 0.35$, and $0 \leq z \leq 0.5$.

6. The optical recording medium according to claim 1 wherein at least one of the Sb-based material and the In-Ag-Te-based material contains a metal M which is at least one element selected from the group consisting of H, Si, C, V, W, Ta, Zn, Ti, Ce, Tb, and Y; and said element M is present in the recording layer at a content of not more than 5 at % and said element M is present in the Sb-based layer at a content of not more than 5 at %.

7. The optical recording medium according to claim 1 wherein at least one of the following four replacements:

partial replacement of Ag by Au, partial replacement of Sb by Bi, partial replacement of Te by Se, partial replacement of In by Al and/or P has taken place.

8. The optical recording medium according to claim 1 wherein number of the interfaces between the Sb-based thin film and the reactive thin film in the recording layer is up to 10.

9. The optical recording medium according to claim 1 wherein the medium has reflectance immediately after the production ($R_O$); reflectance of the crystalline region of the recording layer after repeated recording ($R_C$); and minimum reflectance of the amorphous region of the recording layer after repeated recording ($R_A$) in the relation represented by:

$$R_A < R_O \leq R_C$$

when the reflectance is measured from the side of the transparent substrate.

10. A method for producing an optical recording medium comprising a transparent substrate and a recording layer on the transparent substrate, wherein said recording layer comprises at least one Sb-based thin film and at least one reactive thin film, said Sb-based thin film is in contact with said reactive thin film, said Sb-based thin film is formed from an Sb-based material containing at least 95 at % of Sb, said reactive thin film is formed from an In-Ag-Te-based material mainly comprising In, Ag and Te or In, Ag, Te and Sb, and said reactive thin film contains 0.5 to 10 at % of oxygen, wherein said Sb-based thin film is formed by sputtering, and the sputtering is conducted by introducing an inert gas into the sputtering chamber, and said reactive thin film is formed by sputtering, and the sputtering is conducted by introducing an inert gas and oxygen gas into the sputtering chamber.

11. The method for producing an optical recording medium according to claim 10 wherein said reactive thin film is formed by introducing the oxygen gas at a flow rate which is 2 to 30% of that of the inert gas.

12. The method for producing an optical recording medium according to claim 10 wherein said Sb-based thin film has a thickness of at least 7 nm.

13. The method for producing an optical recording medium according to claim 10 including the step of a mixing treatment wherein the material constituting the Sb-based thin film and the material constituting the reactive thin film are mixed by irradiating the recording layer with a continuous laser beam after the formation of the recording layer.

14. The method for producing an optical recording medium according to claim 13 wherein linear velocity $V_M$ of the recording layer in relation to the laser beam in the mixing treatment and linear velocity $V_W$ of recording the recording layer in relation to the laser beam in the overwriting are controlled such that:

$$0.2V_W \leq V_M.$$

15. The method for producing an optical recording medium according to claim 14 wherein $V_W$ and $V_M$ are controlled such that:

$$V_W \leq V_M.$$

16. The method for producing an optical recording medium according to claim 10 including the step of heat treating the medium at a temperature in the range of 60 to 120° C. immediately after the formation of the recording layer.

17. The method for producing an optical recording medium according to claim 10 wherein the sputtering of the Sb-based thin film is conducted by introducing an inert gas in the sputtering chamber after evacuating to $0.5 \times 10^{-2}$ Pa or less.

* * * * *